(12) United States Patent
Byeon (10) Patent No.: US 9,070,545 B2
(45) Date of Patent: Jun. 30, 2015

(54) INTEGRATED CIRCUIT SYSTEM INCLUDING STACKED CHIPS FOR GENERATING ID INFORMATION

(75) Inventor: Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 127 days.

(21) Appl. No.: 13/620,444

(22) Filed: Sep. 14, 2012

(65) Prior Publication Data

US 2013/0162343 A1   Jun. 27, 2013

(30) Foreign Application Priority Data

Dec. 22, 2011   (KR) ........................ 10-2011-0140453

(51) Int. Cl.
*H01L 25/00*   (2006.01)

(52) U.S. Cl.
CPC ......... *H01L 25/00* (2013.01); *H01L 2924/0002* (2013.01)

(58) Field of Classification Search
None
See application file for complete search history.

(56) References Cited

U.S. PATENT DOCUMENTS

| 7,768,114 B2 * | 8/2010 | Choi ............................. 257/686 |
| 2012/0154020 A1 * | 6/2012 | Lee et al. ...................... 327/530 |

* cited by examiner

*Primary Examiner* — Tuan T Lam
(74) *Attorney, Agent, or Firm* — IP & T Group LLP (57) ABSTRACT

An integrated circuit system includes a first chip including a first node and configured to generate first identification information indicating the first chip in response to a voltage of the first node, a second chip including a second node and configured to generate second identification information indicating the second chip in response to a voltage of the second node, and a channel connected to the first node and the second node and generate a voltage difference between the first node and the second node.

14 Claims, 4 Drawing Sheets

INTEGRATED CIRCUIT SYSTEM INCLUDING STACKED CHIPS FOR GENERATING ID INFORMATION

CROSS-REFERENCE TO RELATED APPLICATIONS

The present application claims priority of Korean Patent Application No. 10-2011-0140453, filed on Dec. 22, 2011, which is incorporated herein by reference in its entirety.

BACKGROUND

1. Field

Exemplary embodiments of the present invention relate to an integrated circuit system.

2. Description of the Related Art

In an integrated circuit system field, a packaging technology of a semiconductor element has been continuously developed with demand for miniaturization and high capacity. There have been developed various technologies for a stacked semiconductor package capable of satisfying mounting efficiency as well as miniaturization and high capacity.

The stacked semiconductor package may be fabricated using a method, in which individual semiconductor chips are stacked upon one another and the stacked chips are packaged at a time, or a method in which individually packaged semiconductor chips are stacked upon one another. In the stacked semiconductor package, the individual semiconductor chips are electrically connected to one another through metal wires, through-silicon vias (TSVs) and the like.

However, in the conventional stacked semiconductor package using metal wires, since electrical signal exchange is performed through the metal wires, speed is low and a large number of wires are used, resulting in the deterioration of electrical characteristics. Furthermore, an additional area is assigned in a substrate in order to form the metal wires, resulting in an increase in the size of the package. Moreover, a cap for wire bonding is provided among semiconductor chips, resulting in an increase in the height of the package.

In this regard, there has been proposed a stacked semiconductor package using a through-silicon via (TSV). In general, the stacked semiconductor package is fabricated by forming via holes passing through semiconductor chips, forming through electrodes (through-silicon vias) by filling the via holes with conductive materials, and electrically connecting upper semiconductor chips to lower semiconductor chips through the through electrodes.

Meanwhile, in order to operate a specific chip in the stacked semiconductor package, IDs are to be assigned to a plurality of semiconductor chips included in the stacked semiconductor package. When the plurality of semiconductor chips are formed using processes different from one another or include circuits different from one another (that is, when the plurality of semiconductor chips have structures different from one another), it is easy to assign IDs to the plurality of semiconductor chips using different structures of the plurality of semiconductor chips. However, it results in a reduction of the product yield and an increase in the fabrication cost to form the plurality of semiconductor chips using the processes different from one another and to package the plurality of semiconductor chips.

Therefore, in order to increase the product yield and reduce the fabrication cost, it is advantageous that semiconductor chips including substantially the same circuits formed using substantially the same processes are stacked upon one another. However, when substantially the same semiconductor chips are stacked upon one another, a method for assigning an ID to each semiconductor chip may be difficult. According to a method for assigning IDs to a plurality of the same semiconductor chips, a fuse circuit included in each semiconductor chip may be programmed, or different ID signals may be applied to the semiconductor chips from an exterior. In the former case, since it may be inconvenient to differently program the fuse circuits of the semiconductor chips one by one. In the latter case, in order to apply different ID signals to the semiconductor chips, different bondings are to be provided for the semiconductor chips.

SUMMARY

An embodiment of the present invention is directed to an integrated circuit system in which IDs are assigned to a plurality of chips using substantially the same circuits included in the chips.

In accordance with an embodiment of the present invention, an integrated circuit system includes: a first chip including a first node and configured to generate first identification (ID) information indicating the first chip in response to a voltage of the first node; a second chip including a second node and configured to generate second ID information indicating the second chip in response to a voltage of the second node; and a channel connected to the first node and the second node and generate a voltage difference between the first node and the second node.

In accordance with another embodiment of the present invention, an integrated circuit system includes: a plurality of stacked chips including identification (ID) nodes, respectively; and a channel configured to connect to the ID nodes to one another and generate a potential difference among the ID nodes, wherein the plurality of chips is configured to generate respective ID information in response to respective voltages of the ID nodes, the ID information indicating the respective chips.

In accordance with further another embodiment of the present invention, an integrated circuit system includes: a first chip including a first node and configured to generate first identification (ID) information indicating the first chip in response to a voltage of the first node; a second chip including a second node and configured to generate second ID information indicating the second chip in response to a voltage of the second node; and a first channel connected to the first node and the second node and generate a voltage difference between the first node and the second node; and one or more second channels configured to apply comparison information to the first chip and the second chip, wherein the first chip and the second chip are configured to be activated when the first and second ID information correspond to the comparison information, respectively.

According to the present technology, substantially the same circuits are formed in a plurality of chips and IDs are assigned to the chips using the circuits without inputting ID information, so that the product yield may be increased and the fabrication cost may be reduced.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 1:
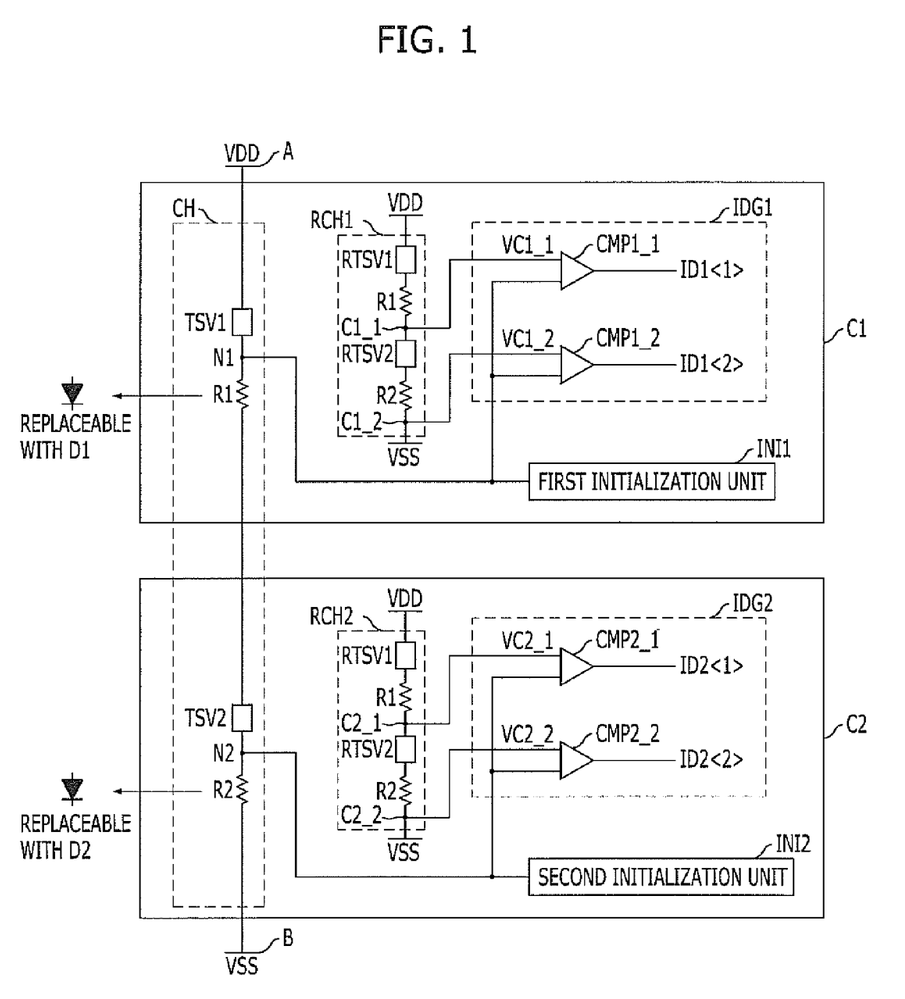
FIG. 1 is a configuration diagram of an integrated circuit system in accordance with an embodiment of the present invention.

FIG. 1 is a configuration diagram of an integrated circuit system in accordance with an embodiment of the present invention.

Referring to FIG. 1, the integrated circuit system includes a first chip C1 provided with a first node N1, a second chip C2 provided with a second node N2 and stacked on the first chip C1, and a channel CH connected to the first node N1 and the second node N2 to generate the potential difference between the first node N1 and the second node N2, wherein the first chip C1 is configured to generate first ID information ID1<1:2> corresponding to the first chip C1 using the voltage of the first node N1, and the second chip C2 is configured to generate second ID information ID2<1:2> corresponding to the second chip C2 using the voltage of the second node N2. The first chip C1 includes a first ID information generation unit (RCH1 and IDG1) configured to generate the first ID information ID1<1:2> in response to the voltage of the first node N1, and the second chip C2 includes a second ID information generation unit (RCH2 and IDG2) configured to generate the second ID information ID2<1:2> in response to the voltage of the second node N2.

The integrated circuit system will be described with reference to FIG. 1.

In order to generate the potential difference between the first node N1 and the second node N2, a first voltage is applied to one end A of the channel and a second voltage lower than the first voltage is applied to the other end B of the channel. Hereinafter, a description will be provided for the case in which the first voltage is a power supply voltage VDD and the second voltage is a baseline voltage VSS. Here, the voltage levels of the first voltage and the second voltage may be changed for different designs.

The channel CH is configured to connect the first node N1 included in the first chip C1 to the second node N2 included in the second chip C2 and generate the potential difference between the first node N1 and the second node N2. The channel CH may include one or more through-silicon vias TSV1 and TSV2. The one or more through-silicon vias TSV1 and TSV2 may be through-silicon vias included in the first chip C1 and the second chip C2. Hereinafter, a description will be provided for the case in which the first chip C1 includes the first through-silicon via TSV1 and the second chip C2 includes the second through-silicon via TSV2.

Furthermore, the channel CH may further include one or more resistive elements R1 and R2 or one or more diodes D1 and D2 in order to generate the potential difference between the first node N1 and the second node N2. The one or more resistive elements R1 and R2 may be resistive elements included in the first chip C1 and the second chip C2, respectively. The one or more diodes D1 and D2 may be diodes included in the first chip C1 and the second chip C2, respectively. The resistive elements R1 and R2 or the diodes D1 and D2 are for generating the distinguishable potential difference between the first node N1 and the second node N2, and the channel CH may include any configuration for generating the potential difference between the first node N1 and the second node N2, instead of the resistive elements or the diodes. Hereinafter, a description will be provided for the case in which the first chip C1 includes the first resistor R1 and the second chip C2 includes the second resistor R2.

FIG. 1 illustrates the case in which the first through-silicon via TSV1, the first resistive element R1 (or the first diode D1), the second through-silicon via TSV2, and the second resistive element R2 (or the second diode D2), which are included in the channel CH, are sequentially coupled in series to one another. The first node N1 is a node through which the first through-silicon via TSV1 and the first resistive element R1 are connected to each other, and the second node N2 is a node through which the second through-silicon via TSV2 and the second resistive element R2 are connected to each other. However, the coupling order of the elements TSV1, R1, TSV2, and R2 is not limited thereto, and the positions of the nodes N1 and N2 may also be changed for different designs, only if the potential difference between the first node N1 and the second node N2 may be apparently recognized.

When the power supply voltage VDD is applied to the one end A of the channel and the baseline voltage VSS is applied to the other end B of the channel, electric current flows from the one end A of the channel to the other end B of the channel. When the electric current flows through both ends of the channel, a voltage drop occurs between the nodes of the channel CH by the first and second through-silicon vias TSV1 and TSV2 and the first and second resistive elements R1 and R2 (or the first and second diodes D1 and D2). Thus, the potential difference is generated between the first node N1 and the second node N2, so that the voltage of the first node N1 is higher than the voltage of the second node N2. When the resistance values of the first and second through-silicon vias TSV1 and TSV2 are RT and the resistance values of the first and second resistive elements R1 and R2 are R (since they are chips fabricated using substantially the same process, they have substantially the same resistance value), the voltage of the first node N1 is $(VDD-VSS)*(RT+2R)/(2RT+2R)$ and the voltage of the second node N2 is $(VDD-VSS)*(R)/(2RT+2R)$ based on the voltage division law.

The first ID information generation unit (RCH1 and IDG1) is configured to generate the first ID information ID1<1:2> corresponding to the first chip C1 in response to the voltage of the first node N1. The second ID information generation unit (RCH2 and IDG2) is configured to generate the second ID information ID2<1:2> corresponding to the second chip C2 in response to the voltage of the second node N2. For this operation, the first ID information generation unit includes the first replica channel RCH1 obtained by modeling the channel CH, and the first information generation unit IDG1 configured to generate the first ID information ID1<1:2> by comparing the voltage of the first node N1 with one or more first comparison voltages VC1_1 and VC1_2 generated from the first replica channel RCH1. Furthermore, the second ID information generation unit includes the second replica channel RCH2 obtained by modeling the channel CH, and the second information generation unit IDG2 configured to generate the second ID information ID2<1:2> by comparing the voltage of the second node N2 with one or more second comparison voltages VC2_1 and VC2_2 generated from the second replica channel RCH2.

The first information generation unit IDG1 includes one or more first comparators CMP1_1 and CMP1_2. The 'CMP1_1' is configured to output a result obtained by comparing the voltage of the first node N1 with the 'VC1_1', and the 'CMP1_2' is configured to output a result obtained by comparing the voltage of the first node N1 with the 'VC1_2'. The second information generation unit IDG2 includes one or more second comparators CMP2_1 and CMP2_2. The 'CMP2_1' is configured to output a result obtained by comparing the voltage of the second node N2 with the 'VC2_1', and the 'CMP2_2' is configured to output a result obtained by comparing the voltage of the second node N2 with the 'VC2_2'. Among the one or more first comparison voltages VC1_1 and VC1_2 and the one or more second comparison voltages VC2_1 and VC2_2, comparison voltages corresponding to each other may have substantially the same voltage level. Hereinafter, for example, the operations of the information generation units IDG1 and IDG2 will be described.

For example, the 'VC1_1' and the 'VC2_1' may have substantially the same level, that is, a level between the voltage of the first node N1 and the voltage of the second node N2, while the 'VC1_2' and the 'VC2_2' have substantially the same level, that is, a level lower than the voltage of the second node N2. Furthermore, the 'CMP1_1 and CMP1_2' are configured to output '1' when the voltage of the first node N1 is higher than the first comparison voltages VC1_1 and VC1_2 and to output '0' when the voltage of the first node N1 is lower than the first comparison voltages VC1_1 and VC1_2. The 'CMP2_1 and CMP2_2' are configured to output '1' when the voltage of the second node N2 is higher than the second comparison voltages VC2_1 and VC2_2 and to output '0' when the voltage of the second node N2 is lower than the second comparison voltages VC2_1 and VC2_2. Since the voltage of the first node N1 is higher than the 'VC1_1' and the 'VC1_2', the 'CMP1_1' and the 'CMP1_2' output '1', respectively. Thus, the first ID information ID1<1:2> is '11'. Since the voltage of the second node N2 is lower than the 'VC2_1' and is higher than the 'VC2_2', the 'CMP2_1' outputs '0' and the 'CMP2_2' outputs '1'. Thus, the second ID information ID2<1:2> is '01'. That is, the ID information generation unit (RCH1 and IDG1, and RCH2 and IDG2) is a kind of analog-to-digital converter (ADC) that performs an operation for converting the levels of the voltages of the nodes N1 and N2, which are analog signals, into the ID information ID1<1:2> and ID2<1:2> which are digital signals.

The comparison voltages VC1_1, VC1_2, VC2_1, and VC2_2 or the voltages of the nodes N1 and N2 may also be designed such that the first ID information ID1<1:2> is '01' and the second ID information ID2<1:2> is '00'. That is, this represents that ID information having different values is generated using the voltage difference between the nodes, and the exact voltages of the nodes and the exact values of each ID information may be changed for different designs. This is also applied to an integrated circuit system of FIG. 2 which will be described later.

The reason for using the replica channels RCH1 and RCH2 in order to generate the comparison voltages VC1_1, VC1_2, VC2_1, and VC2_2 is because comparison voltages having an appropriate level may be generated only by selecting nodes included in the replica channels RCH1 and RCH2. Each of the replica channels RCH1 and RCH2 includes the first and second resistive elements R1 and R2 (or the first and second diodes D1 and D2 depending on the configuration of the channel) included in the channel CH, and one or more replica through-silicon vias RTSV1 and RTSV2 obtained by modeling the resistance values of the first and second through-silicon vias TSV1 and TSV2. Here, the first replica through-silicon via RTSV1 is obtained by modeling the resistance value of the first through-silicon via TSV1, and the second replica through-silicon via RTSV2 is obtained by modeling the resistance value of the second through-silicon via TSV2.

As with the channel CH, the power supply voltage VDD and the baseline voltage VSS are applied to both ends of the replica channels RCH1 and RCH2. The 'VC1_1' and the 'VC1_2' may be voltages generated in internal nodes C1_1 and C1_2 of the first replica channel RCH1, respectively, and the 'VC2_1' and the 'VC2_2' may be voltages generated in internal nodes C2_1 and C2_2 of the second replica channel RCH2, respectively. Nodes, at which the 'VC1_1', the 'VC1_2', the 'VC2_1', and the 'VC2_2' are generated, are not limited to the above nodes. For example, any nodes may be employed if they may generate comparison voltages by which the voltage of the first node N1 and the voltage of the second node 2 may be converted into digital signals distinguishable from each other.

The first chip C1 and the second chip C2 may further include a first initialization unit INI1 and a second initialization unit INI2 for setting the ID information ID1<1:2> and ID2<1:2> of the chips as initial values, respectively, when they have not been stacked. When the chips have not been stacked, the initialization units INI1 and INI2 input a voltage lower than the voltage of the second node N2 to the ID information generation units (RCH1 and IDG1, and RCH2 and IDG2), thereby initializing the ID information ID1<1:2> and ID2<1:2> to be '00'.

In accordance with the integrated circuit system according to the present invention, even when the first chip C1 and the second chip C2 have substantially the same configuration, the potential difference is generated between the first node N1 included in the first chip C1 and the second node N2 included in the second chip C2 by using the channel CH in which a plurality of elements are coupled in series to one another. The voltage of the first node N1 and the voltage of the second node N2 are converted into digital signals by using comparison voltages having substantially the same voltage level, so that different IDs may be assigned to the chips. Consequently, IDs may be assigned to the semiconductor chips included in the semiconductor packages while improving the product yield and reducing the fabrication cost. Here, when the channel CH is formed only by through-silicon vias, metal lines, and contacts, since no potential difference is generated between the first node N1 and the second node N2 (the resistances of the through-silicon vias, the metal lines, and the contacts are very small), it is difficult to distinguish digital signals from each other when the voltage of the first node N1 and the voltage of the second node N2 are converted into the digital signals. In this regard, the channel CH includes resistive elements, diodes, and the like for generating a distinguishable potential difference between the first node N1 and the second node N2.

Figure 2:
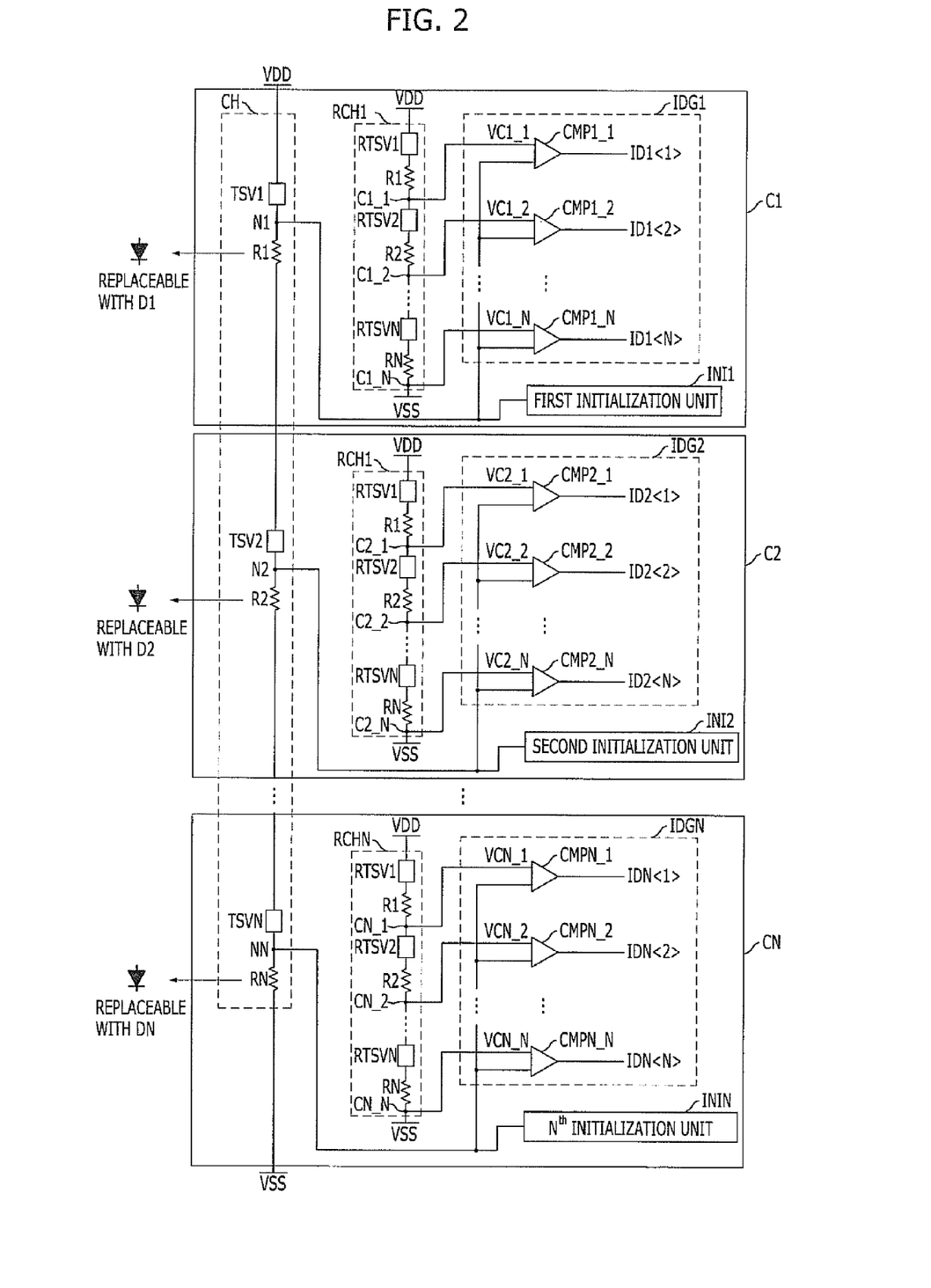
FIG. 2 is a configuration diagram of an integrated circuit system in accordance with another embodiment of the present invention.

FIG. 2 is a configuration diagram of an integrated circuit system in accordance with another embodiment of the present invention. FIG. 2 is obtained by applying the embodiment of FIG. 1 to a general case.

The integrated circuit system includes a plurality of stacked chips C1 to CN, which have ID nodes N1 to NN, respectively, and a channel CH, which connects the ID nodes N1 to NN to one another and generates the potential difference among the ID nodes N1 to NN, wherein the plurality of chips C1 to CN is configured to generate corresponding ID information ID1<1:N> to IDN<1:N> using the voltages of the respective ID nodes N1 to NN included therein. The plurality of chips C1 to CN include ID information generation units (RCH1 and IDG1 to RCHN and IDGN) configured to generate the corresponding ID information ID1<1:N> to IDN<1:N> in response to the voltages of the ID nodes N1 to NN included therein, respectively.

The integrated circuit system will be described with reference to FIG. 2.

In order to generate the potential difference among the ID nodes N1 to NN, a first voltage is applied to one end A of the channel and a second voltage lower than the first voltage is applied to the other end B of the channel. Hereinafter, a description will be provided for the case in which the first voltage is a power supply voltage VDD and the second voltage is a baseline voltage VSS. Here, the voltage levels of the first voltage and the second voltage may be changed for different designs.

The channel CH is configured to connect the ID nodes N1 to NN included in the plurality of chips C1 to CN to one another and generate the potential difference among the ID nodes N1 to NN. The channel CH may include one or more through-silicon vias TSV1 to TSVN. The one or more through-silicon vias TSV1 to TSVN may be through-silicon vias included in the plurality of chips C1 to CN. Hereinafter, a description will be provided for the case in which the plurality of chips C1 to CN include the corresponding through-silicon vias TSV1 to TSVN, respectively.

Furthermore, the channel CH may further include one or more resistive elements R1 to RN or one or more diodes D1 to DN in order to generate the potential difference among the ID nodes N1 to NN. The one or more resistive elements R1 to RN may be resistive elements included in the plurality of chips C1 to CN, respectively. The one or more diodes D1 to DN may include diodes included in the plurality of chips C1 to CN, respectively. The resistive elements R1 to RN or the diodes D1 to DN are used for generating a distinguishable potential difference among the ID nodes N1 to NN, and the channel CH may include any configuration for generating the potential difference among the ID nodes N1 to NN, instead of the resistive elements or the diodes. Hereinafter, a description will be provided for the case in which the plurality of chips C1 to CN include the corresponding resistive elements R1 to RN, respectively.

FIG. 2 illustrates the case in which the through-silicon vias TSV1 to TSVN and the resistive elements R1 to RN, which are included in the channel CH, are alternately coupled in series to one another, and the ID nodes N1 to NN are nodes through which a corresponding through-silicon via of the through-silicon vias TSV1 to TSVN and a corresponding resistive element of the resistive elements R1 to RN are connected to each other. However, the coupling order of the elements TSV1 to TSVN and R1 to RN is not limited thereto, and the positions of the ID nodes N1 to NN may also be changed for different designs, as long as the potential difference among the ID nodes N1 to NN is readily recognized.

When the power supply voltage VDD is applied to the one end A of the channel and the baseline voltage VSS is applied to the other end B of the channel, electric current flows from the one end A of the channel to the other end B of the channel. When the electric current flows through both ends of the channel, a voltage drop occurs among the nodes of the channel CH by the through-silicon vias TSV1 to TSVN and the resistive elements R1 to RN (or the diodes D1 to DN). Thus, the potential difference is generated among the ID nodes N1 to NN, and an ID node adjacent to the one end A of the channel has a high voltage. At this time, the voltages of the ID nodes N1 to NN are determined based on the voltage division law as described in FIG. 1.

The ID information generation units (RCH1 and IDG1 to RCHN and IDGN) included in the plurality of chips C1 to CN are configured to generate the corresponding ID information ID1<1:N> to IDN<1:N> in response to the corresponding voltages of the ID nodes N1 to NN, respectively. For this operation, the ID information generation units include replica channels RCH1 to RCHN and information generation units IDG1 to IDGN, respectively. The replica channels RCH1 to RCHN are obtained by modeling the channel CH, and the information generation units IDG1 to IDGN are configured to generate the ID information ID1<1:N> to IDN<1:N> by comparing the voltage of the ID nodes N1 to NN with one or more comparison voltages VC1_1 to VC1_N, ~, VCN_1 to VCN_N generated from the replica channels RCH1 to RCHN, respectively.

The information generation units IDG1 to IDGN includes one or more comparators CMP1_1 to CMP1_N, ~,CMPN_1 to CMPN_N, respectively. The one or more first comparators CMP1_1 to CMP1_N included in the first information generation unit IDG1 are configured to output results obtained by comparing the voltage of the first ID node N1 with one or more comparison voltages VC1_1 to VC1_N generated from the first replica channel RCH1. The second to $N^{th}$ information generation units IDG2 to IDGN are configured to output results obtained by comparing one or more comparison voltages VC2_1 to VC2_N, ~, VCN_1 to VCN_N with the voltages of the corresponding ID nodes N2 to NN through one or more comparators CMP2_1 to CMPN_N, ~,CMPN_1 to CMPN_N included in therein. Here, as with FIG. 1, the corresponding comparison voltages may have substantially the same voltage level (for example, a VC1_1 to a VCN_1 have substantially the same voltage level). Hereinafter, for example, the operations of the information generation units IDG1 to IDGN will be described.

For example, the 'VC1_K' to the 'VCN_K' (1≤K≤N) may have substantially the same level and have a voltage level lower than the voltage of a $K^{th}$ ID node NK and higher than the voltage of an $(K+1)^{th}$ ID node NK+1 in FIG. 2. Furthermore, the one or more comparators CMP1_1 to CMPN_N, ~,CMPN_1 to CMPN_N compare a voltage of an ID node (one of the N1 to the NN) input thereto with a comparison voltage (one of the VC2_1 to the VC2_N, ~, the VCN_1 to the VCN_N) and outputs '1' when the voltage of the ID node is higher than the comparison voltage while outputting '0' when the comparison voltage is higher than the voltage of the ID node. Since the voltage of the first ID node N1 is higher than the 'VC1_1' to the 'VC1_N', the 'CMP1_1' to the 'CMPN_N' output '1'. Thus, the first ID information ID1<1:N> is '11 . . . 1' ('1' is N bits). Since the voltage of the second ID node N2 is lower than the 'VC2_1' and is higher than the 'VC2_2' to the 'VCN_N', the 'CMP2_1' outputs '0' and the 'CMP2_2' to the 'CMP2_N' output '1'. Thus, the second ID information ID2<1:N> is '01 . . . 1' ('O' is 1 bit and '1' is N−1 bits). Since the voltage of the $K^{th}$ ID node NK is lower than the 'VCK_1' to the 'VCK_K−1' and higher than the 'VCK_K' to the 'VCK_N', the CMPK_1' to the 'CMPK_K−1' output '0' and the CMPK_K' to the 'CMPK_N' output '1'. Thus, $K^{th}$ ID information IDK<1:N> is '00 . . . 1' ('0' is K−1 bits and '1' is N—K+1 bits). That is, the ID information generation unit (RCH1 and IDG1 to RCHN and IDGN) is a kind of analog-to-digital converter (ADC) that performs an operation for converting the levels of the voltages of the nodes N1 to NN, which are analog signals, into the ID information ID1<1:N> to IDN<1:N> which are digital signals.

The reason for using the replica channels RCH1 to RCHN in order to generate the comparison voltages VC1_1 to VC1_N, ~,VCN_1 to VCN_N is because comparison voltages having an appropriate level may be generated merely by selecting nodes included in the replica channels RCH1 to RCHN. Each of the replica channels RCH1 to RCHN includes the first to $N^{th}$ resistive elements R1 to RN (or the first to $N^{th}$ diodes D1 to DN) included in the channel CH, and one or more replica through-silicon vias RTSV1 to RTSVN obtained by modeling the resistance values of the first to $N^{th}$ through-silicon vias TSV1 to TSVN. Here, a $k^{th}$ replica through-silicon via RTSVK is obtained by modeling the resistance value of a $k^{th}$ through-silicon via TSVK.

As with the channel CH, the power supply voltage VDD and the baseline voltage VSS are applied to both ends of the replica channels RCH1 to RCHN. The 'VCK_1' to the 'VCK_N' may be voltages generated in first to N internal nodes CK_1 to CK_N of a $k^{th}$ replica channel RCHK, respectively. Nodes, at which the comparison voltages VC1_1 to VCN_N, ~,VCN_1 to VCN_N are generated, are not limited to the above nodes. For example, any nodes may be employed if they may generate comparison voltages by which the voltages of the first to $N^{th}$ ID nodes N1 to NN may be converted into digital signals distinguishable from one another.

The plurality of chips C1 to CN may further include first to $N^{th}$ initialization units INI1 to ININ for setting the ID information ID1<1:N> to IDN<1:N> of the chips as initial values, respectively, when they have not been stacked. When the chips have not been stacked, the initialization units INI1 to ININ input a voltage lower than the voltage of the $N^{th}$ node NN to the ID information generation units (RCH1 and IDG1 to RCHN and IDGN), thereby initializing the ID information ID1<1:N> to IDN<1:N> to be '00 . . . 0' ('0' is N bits).

In accordance with the integrated circuit system according to the present invention, even when the plurality of chips C1 to CN have substantially the same configuration, the potential difference is generated among the ID nodes N1 to NN included in the chips by using the channel CH in which a plurality of elements are coupled in series to one another. The voltages of the first to $N^{th}$ ID nodes N1 to NN are converted into digital signals by using comparison voltages having substantially the same voltage level, so that different IDs may be assigned to the chips. Consequently, IDs may be assigned to the semiconductor chips included in the semiconductor packages while improving the product yield and reducing the fabrication cost.

Figure 3:
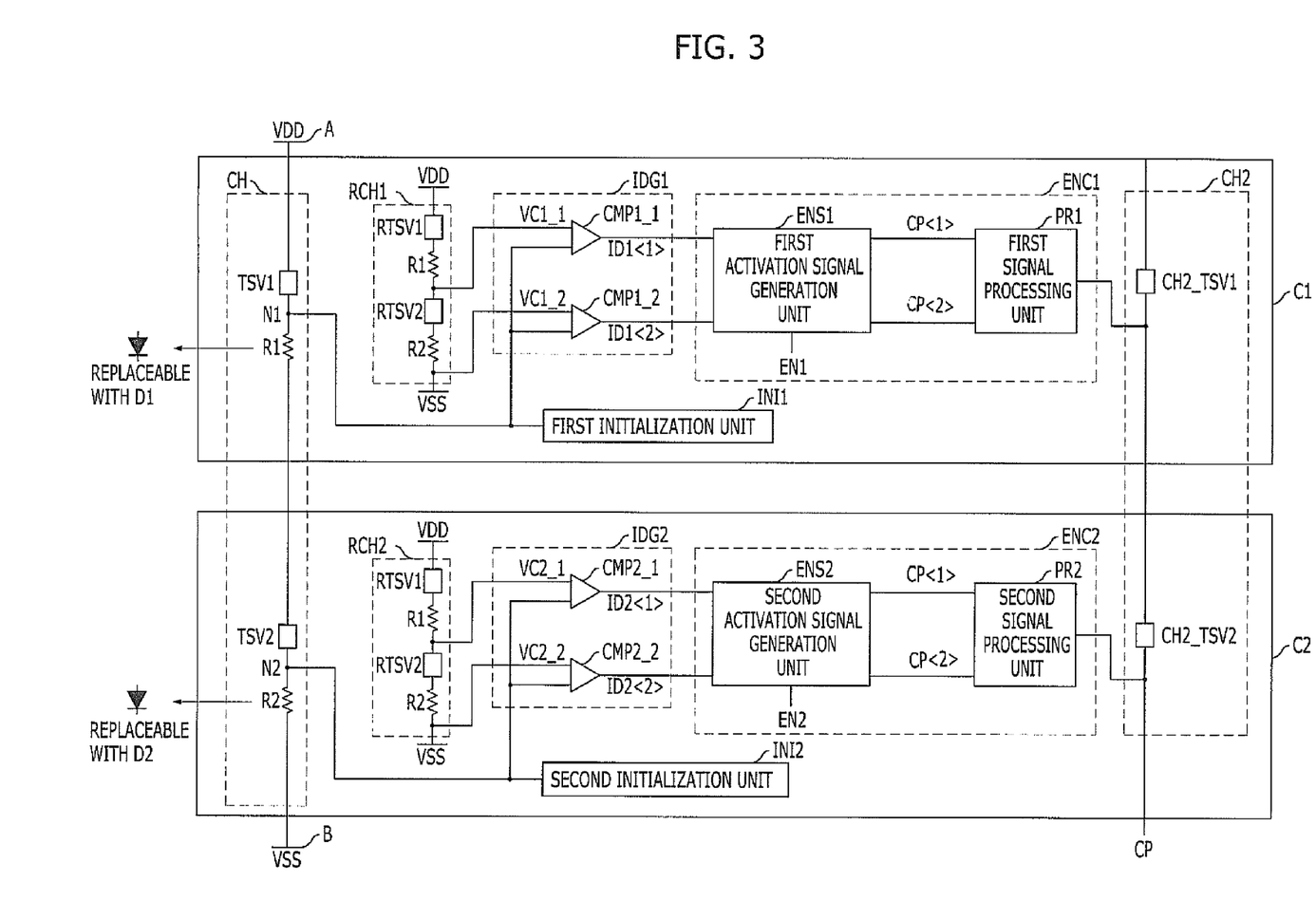
FIG. 3 is a configuration diagram of an integrated circuit system in accordance with another embodiment of the present invention.

FIG. 3 is a configuration diagram of an integrated circuit system in accordance with another embodiment of the present invention. The integrated circuit system of FIG. 3 further includes a configuration for receiving comparison information CP, which indicates whether a first chip C1 or a second chip C2 has been selected, comparing the comparison information CP with ID information ID1<1:2> and ID2<1:2> generated in the chips, and activating a chip corresponding to the input comparison information CP, in addition to the configuration of the integrated circuit system of FIG. 1.

Referring to FIG. 3, the integrated circuit system includes the first chip C1 provided with a first node N1, the second chip C2 provided with a second node N2 and stacked on the first chip C1, a first channel CH connected to the first node N1 and the second node N2 to generate the potential difference between the first node N1 and the second node N2, and one or more second channels CH2 configured to apply the comparison information CP to the first chip C1 and the second chip C2. The first chip C1 is configured to generate first ID information ID1<1:2> corresponding to the first chip C1 using the voltage of the first node N1 and activated when the first ID information ID1<1:2> corresponds to the comparison information CP, and the second chip C2 is configured to generate second ID information ID2<1:2> corresponding to the second chip C2 using the voltage of the second node N2 and activated when the second ID information ID2<1:2> corresponds to the comparison information CP.

Hereinafter, the integrated circuit system will be described with reference to FIG. 3.

The first chip C1 includes a first ID information generation unit (RCH1 and IDG1) configured to generate the first ID information ID1<1:2> in response to the voltage of the first node N1, and a first chip activation unit ENC1 configured to activate the first chip C1 when the first ID information ID1<1:2> corresponds to the comparison information CP. The second chip C2 includes a second ID information generation unit (RCH2 and IDG2) configured to generate the second ID information ID2<1:2> in response to the voltage of the second node N2, and a second chip activation unit ENC2 configured to activate the second chip C2 when the second ID information ID2<1:2> corresponds to the comparison information CP.

In the integrated circuit system of FIG. 3, the configurations and operations of the first and second ID information generation units (RCH1 and IDG1, and RCH2 and IDG2) configured to generate the ID information ID1<1:2> and ID2<1:2> of the chips are substantially the same as those of the first and second ID information generation units of the integrated circuit system of FIG. 1. Furthermore, the configuration of the channel CH of FIG. 3 is substantially the same as that of the channel CH of FIG. 1. Hereinafter, an operation for comparing the ID information ID1<1:2> and ID2<1:2> generated in the chips C1 and C2 with the input comparison information CP and activating the chips C1 and C2 will be mainly described.

The comparison information CP is used for selecting a chip which executes a command applied from the exterior of the integrated circuit system, and it is applied to the first chip C1 and the second chip C2 through the one or more second channels CH2 provided in the integrated circuit system. The one or more second channels CH2 may include one or more through-silicon vias CH2_TSV1 and CH2_TSV2, respectively. FIG. 3 illustrates the case in which 1-bit comparison information CP is input through one second channel CH2, processed, and then compared with the ID information ID1<1:2> and ID2<1:2>. However, the configuration of FIG. 3 may be changed for different designs. Details thereof will be described later in FIG. 4.

The first chip activation unit ENC1 includes a first signal processing unit PR1 and a first activation signal generation unit ENS1, wherein the first signal processing unit PR1 is configured to encode or decode the first ID information ID1<1:2> or the comparison information CP to a comparable form, and the first activation signal generation unit ENS1 is configured to compare the first ID information ID1<1:2> with the comparison information CP using the output of the first signal processing unit PR1, and generate a first chip activation signal EN1 for activating the first chip C1 when the first ID information ID1<1:2> corresponds to the comparison information CP. Furthermore, the second chip activation unit ENC2 includes a second signal processing unit PR2 and a second activation signal generation unit ENS2, wherein the second signal processing unit PR2 is configured to encode or decode the second ID information ID2<1:2> or the comparison information CP to a comparable form, and the second activation signal generation unit ENS2 is configured to compare the second ID information ID2<1:2> with the comparison information CP using the output of the second signal processing unit PR2, and generate a second chip activation signal EN2 for activating the second chip C2 when the second ID information ID2<1:2> corresponds to the comparison information CP.

In FIG. 3, since the ID information ID1<1:2> and ID2<1:2> is 2-bit information and the comparison information CP is 1-bit information, the ID information ID1<1:2> and ID2<1:2> may not be directly compared with the comparison information CP. Therefore, the ID information ID1<1:2> and ID2<1:2> is converted to 1-bit information by encoding the ID information ID1<1:2> and ID2<1:2> using the signal processing units PR1 and PR2 and compared with the comparison information CP which is 1-bit information. Alternatively, the comparison information CP is converted to 2-bit information by decoding the comparison information CP and compared with the ID information ID1<1:2> and ID2<1:2> which is 2-bit information. Hereinafter, the latter case will be described. The former case will be described later in FIG. 4. When the number of bits of the comparison information is substantially the same as that of the ID information, since it is not necessary to encode or decode the ID information or the comparison information, the chip activation units ENC1 and ENC2 may not include the signal processing units PR1 and PR2, respectively. That is, the activation signal generation units ENS1 and ENS2 may directly compare corresponding bits of the ID information with corresponding bits of the comparison information and generate the chip activation signals EN1 and EN2.

The first and second signal processing units PR1 and PR2 are configured to decode the comparison information CP and generate 2-bit processed information CPP<1:2>. Hereinafter, the 'CPP<1>' corresponds to an 'ID1<1>' and an 'ID2<1>', and the 'CPP<2>' corresponds to an 'ID1<2>' and an 'ID2<2>'. For example, comparison information CP of '1' is input when the first chip C1 is activated, and comparison information CP of '0' is input when the second chip C2 is activated. Then, the first and second signal processing units PR1 and PR2 decode the comparison information CP of '1' to generate processed information CPP<1:2> of '11' and decode the comparison information CP of '0' to generate processed information CPP<1:2> of '10'.

As a comparison result of the first ID information ID1<1:2> and the processed information CPP<1:2>, when the first ID information ID1<1:2> is substantially the same as the processed information CPP<1:2> (when the processed information CPP<1:2> is '11', that is, input comparison information CP corresponds to the first ID information ID1<1:2>), the first activation signal generation unit ENS1 activates the first chip activation signal EN1. Furthermore, as a comparison result of the second ID information ID2<1:2> and the processed information CPP<1:2>, when the second ID information ID2<1:2> is substantially the same as the processed information CPP<1:2> (when the processed information CPP<1:2> is '10', that is, input comparison information CP corresponds to the second ID information ID2<1:2>), the second activation signal generation unit ENS2 activates the second chip activation signal EN2.

A chip activated in response to the chip activation signal performs an operation in response to a command applied from the exterior of the integrated circuit system. Hereinafter, the operation of a chip when the integrated circuit system is a memory system will be described as an example. Here, both the first chip C1 and the second C2 may be slave chips, or one of the first chip C1 and the second C2 may be a master chip and the other one may be a slave chip.

For example, when a data write command, an address, data to be written, and comparison information CP of '1' are input from the exterior of the memory chip, the first chip C1 performs data write operation. The write command, the address, and the data are applied to the first chip C1 and the second C2 through a plurality of channels (not illustrated in FIG. 3) commonly coupled to the first chip C1 and the second C2. As described above, since the comparison information CP of '1' corresponds to the first ID information ID1<1:2>, the first chip activation unit ENC1 activates the first chip C1 and the second chip activation unit ENC2 does not activate the second chip C2. The activated first chip C1 receives the write command, the address, and the data, and performs an operation for writing the data in a memory cell designated by the address. The second chip C2 does not receive the write command, the address, and the data because the second chip C2 has not been activated.

Next, when a data read command, an address, and comparison information CP of '0' are input from the exterior of the memory chip, the second chip C2 performs data read operation. As described above, since the comparison information CP of '0' corresponds to the second ID information ID2<1:2>, the first chip activation unit ENC1 does not activate the first chip C1 and the second chip activation unit ENC2 activates the second chip C2. The first chip C1 does not receive the read command and the address because the first chip C1 has not been activated, and the activated second chip C2 receives the read command and the address, and performs an operation for reading data of a memory cell designated by the address.

FIG. 3 illustrates the case in which the number of the semiconductor chips included in the integrated circuit system is 2. However, the integrated circuit system may be applied to an integrated circuit system including N semiconductor chips as illustrated in FIG. 2. When an integrated circuit system includes N semiconductor chips, ID information of each chip may include N-bit digital signals generated by converting the voltages of N different nodes N1 to NN as illustrated in FIG. 2, the voltages being different from one another. Furthermore, comparison information may include X-bit digital signals (X is an integer larger than a $\log_2 N$). A chip activation unit of each chip activates a corresponding chip when comparison information input through X channels corresponds to ID information of a chip including the chip activation unit.

In accordance with the integrated circuit system according to the present invention, the first chip C1 and the second chip C2 have substantially the same configuration, different IDs may be assigned to the chips, and only a chip having an ID corresponding to information input from an exterior may be activated.

Figure 4:
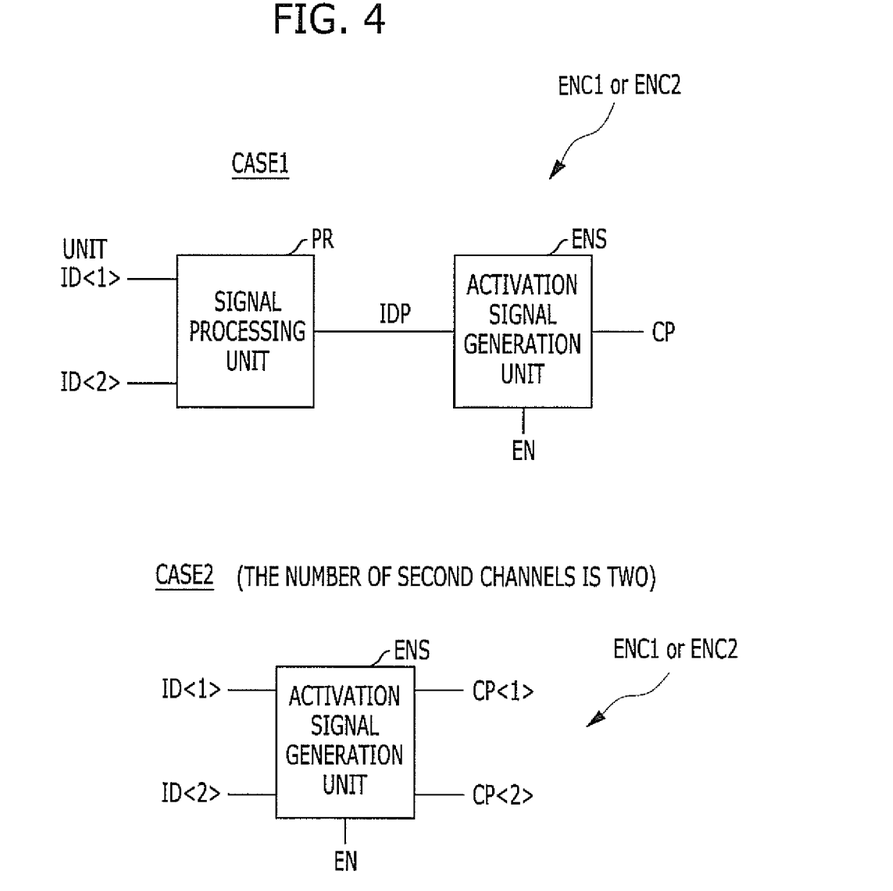
FIG. 4 is a configuration diagram of chip activation units (ENC1 and ENC2) of FIG. 3 in accordance with another embodiment.

FIG. 4 is a configuration diagram of the chip activation units (ENC1 and ENC2) of FIG. 3 in accordance with another embodiment.

FIG. 3 illustrates the case in which the processed information CPP<1:2> obtained by decoding the comparison information CP is compared with the ID information ID1<1:2> and ID2<1:2>, and the chip activation signals EN1 and EN2 are activated.

Hereinafter, a description will be provided for the case in which processed ID information IDP obtained by encoding ID information (ID<1:2>, corresponds to the ID1<1:2> or ID2<1:2> of FIG. 3) is compared with comparison information CP and a chip activation signal EN is activated, and the case in which the ID information ID<1:2> is compared with comparison information CP<1:2> having the number of bits substantially the same as that of the ID information ID<1:2>, and the chip activation signal EN is activated.

(1) CASE1 in which the processed ID information IDP obtained by encoding the ID information ID<1:2> is compared with the comparison information CP and the chip activation signal EN is activated A signal processing unit (PR, corresponds to the PR1 of PR2 of FIG. 3) encodes the 2-bit ID information ID<1:2> to generate the processed ID information IDP. For example, the signal processing unit PR encodes ID information ID<1:2> of '11' to generate processed ID information IDP of '1' or encodes ID information ID<1:2> of '10' to generate processed ID information IDP of '0'.

An activation signal generation unit (ENS, corresponds to the ENS1 of ENS2 of FIG. 3) activates a chip activation signal (EN, corresponds to the EN1 of EN2 or FIG. 3) when the processed ID information IDP is substantially the same as the input comparison information CP, and it does not activate the chip activation signal EN when the processed ID information IDP is not substantially the same as the input comparison information CP.

(2) CASE2 in which the ID information ID<1:2> is compared with the comparison information CP<1:2> having the number of bits substantially the same as that of the ID information ID<1:2>, and the chip activation signal EN is activated.

In this case, the signal processing unit PR described in FIG. 3 may be omitted. Instead of the signal processing unit PR, the number of second channels CH2 for receiving the 2-bit comparison information CP<1:2> is increased. In the case of FIG. 3, the number of second channels CH2 is 1. However, in this case, the number of second channels CH2 is increased to 2. In a general case, the number of second channels CH2 is to be equal to or more than the number of semiconductor chips included in an integrated circuit system.

An activation signal generation unit ENS activates a chip activation signal (EN, corresponds to the EN1 or EN2 of FIG. 3) when the ID information ID<1:2> is substantially the same as the input comparison information CP<1:2>, and it does not activate the chip activation signal EN when the ID information ID<1:2> is not substantially the same as the input comparison information CP<1:2>.

While the present invention has been described with respect to the specific embodiments, it will be apparent to those skilled in the art that various changes and modifications may be made without departing from the spirit and scope of the invention as defined in the following claims.

What is claimed is:

1. An integrated circuit system comprising:
a channel connected to a first node and a second node and configured to generate a voltage difference between the first node and the second node;
a first chip including the first node and a first replica channel obtained by modeling the channel and configured to generate first identification (ID) information corresponding to the first chip by comparing a voltage of the first node with one or more first comparison voltages generated from the first replica channel; and
a second chip stacked on the first chip, and including the second node and a second replica channel obtained by modeling the channel and configured to generate second ID information corresponding to the second chip by comparing a voltage of the second node with one or more second comparison voltages generated from the second replica channel.

2. The integrated circuit system of claim 1, wherein a first voltage is applied to one end of the channel and a second voltage lower than the first voltage is applied to the other end of the channel.

3. The integrated circuit system of claim 2, wherein the first chip comprises:
a first information generation unit configured to generate the first ID information by comparing the voltage of the first node with the one or more first comparison voltages generated from the first replica channel,
wherein the second chip comprises:
a second information generation unit configured to generate the second ID information by comparing the voltage of the second node with the one or more second comparison voltages generated from the second replica channel.

4. The integrated circuit system of claim 1, wherein the channel comprises:
one or more through-silicon vias included in the first chip or the second chip,
wherein each of the first replica channel and the second replica channel comprises:
one or more replica through-silicon vias obtained by modeling resistance values of the one or more through-silicon vias.

5. The integrated circuit system of claim 1, wherein the channel comprises:
one or more resistive elements or one or more diodes.

6. An integrated circuit system comprising:
a plurality of chips stacked on one another, each chip including an identification (ID) node; and
a channel configured to connect the ID nodes to one another and generate a potential difference among the ID nodes,
wherein each of the plurality of chips further includes a replica channel obtained by replicating the channel and generates corresponding ID information by comparing a voltage of the corresponding ID node with one or more comparison voltages generated from each corresponding replica channel.

7. The integrated circuit system of claim 6, wherein a first voltage is applied to one end of the channel and a second voltage lower than the first voltage is applied to the other end of the channel.

8. The integrated circuit system of claim 6, wherein each of the plurality of chips further comprises:
an information generation unit configured to generate the corresponding ID information by comparing the voltage of the corresponding ID node with the one or more comparison voltages generated from the replica channel.

9. An integrated circuit system comprising:
a first channel connected to a first node and a second node and configured to generate a voltage difference between the first node and the second node;
a first chip including the first node and a first replica channel obtained by modeling the first channel and configured to generate first identification (ID) information corresponding to the first chip by comparing a voltage of the first node with one or more first comparison voltages generated from the first replica channel;
a second chip stacked on the first chip, and including the second node and a second replica channel obtained by modeling the first channel and configured to generate second ID information corresponding to the second chip by comparing a voltage of the second node with one or more second comparison voltages generated from the second replica channel; and
one or more second channels configured to apply comparison information to the first chip and the second chip, wherein the first chip and the second chip are configured to be activated when the first and second ID information correspond to the comparison information, respectively.

10. The integrated circuit system of claim 9, wherein a first voltage is applied to one end of the first channel and a second voltage lower than the first voltage is applied to the other end of the first channel.

11. The integrated circuit system of claim 9, wherein the first chip further comprises:
- a first ID information generation unit configured to generate the first ID information in response to the voltage of the first node; and
- a first chip activation unit configured to activate the first chip by comparing the first ID information with the comparison information, wherein the second chip further comprises:
- a second ID information generation unit configured to generate the second ID information in response to the voltage of the second node; and
- a second chip activation unit configured to activate the second chip by comparing the second ID information with to the comparison information.

12. The integrated circuit system of claim 11, wherein the first chip activation unit comprises:
- a first signal processing unit configured to convert the first ID information or the comparison information into a comparable form; and
- a first activation signal generation unit configured to compare the first ID information with the comparison information using output of the first signal processing unit and generate a first chip activation signal for activating the first chip when the first ID information corresponds to the comparison information, wherein the second chip activation unit comprises:
- a second signal processing unit configured to convert the second ID information or the comparison information into a comparable form; and
- a second activation signal generation unit configured to compare the second ID information with the comparison information using output of the second signal processing unit and generate a second chip activation signal for activating the second chip when the second ID information corresponds to the comparison information.

13. The integrated circuit system of claim 9, wherein an activated chip of the first chip and the second chip is configured to perform an operation in response to a command applied from an exterior of the integrated circuit system.

14. The integrated circuit system of claim 9, wherein each of the one or more second channels comprises:
- one or more through-silicon vias.

* * * * *